United States Patent
Honer et al.

(10) Patent No.: US 8,053,281 B2
(45) Date of Patent: Nov. 8, 2011

(54) METHOD OF FORMING A WAFER LEVEL PACKAGE

(75) Inventors: Kenneth Allen Honer, Santa Clara, CA (US); Belgacem Haba, Saratoga, CA (US); David Ovrutsky, Charlotte, NC (US); Charles Rosenstein, Ramat Beit Shemesh (IL); Guilian Gao, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 363 days.

(21) Appl. No.: 12/315,855

(22) Filed: Dec. 4, 2008

(65) Prior Publication Data
US 2009/0162975 A1 Jun. 25, 2009

Related U.S. Application Data

(60) Provisional application No. 61/005,607, filed on Dec. 6, 2007.

(51) Int. Cl.
*H01L 21/00* (2006.01)
(52) U.S. Cl. . 438/118; 438/113; 257/676; 257/E23.039; 257/E23.04
(58) Field of Classification Search ........... 257/E23.039, 257/E23.04
See application file for complete search history.

(56) References Cited

U.S. PATENT DOCUMENTS

| | | | | |
|---|---|---|---|---|
| 5,583,378 A * | 12/1996 | Marrs et al. | ................... | 257/710 |
| 6,242,283 B1 * | 6/2001 | Lo et al. | ........................ | 438/106 |
| 6,389,689 B2 * | 5/2002 | Heo | ............................... | 29/840 |
| 2006/0270107 A1 * | 11/2006 | Morrison et al. | ............. | 438/106 |
| 2007/0215992 A1 * | 9/2007 | Shen et al. | .................... | 257/668 |
| 2008/0042255 A1 * | 2/2008 | Chen | ............................ | 257/698 |

* cited by examiner

*Primary Examiner* — Ha Tran T Nguyen
*Assistant Examiner* — Shaka Scarlett
(74) *Attorney, Agent, or Firm* — Lerner, David, Littenberg, Krumholz & Mentlik, LLP

(57) ABSTRACT

A method is provided for forming a microelectronic package at a wafer level. Such method can include providing a semiconductor wafer having a surface with a pattern of electrical contacts thereon. An interposer component can be provided which has a compliant dielectric layer bonded to a conductive layer. A pattern of holes can be formed through the compliant dielectric layer and the conductive layer which corresponds to the pattern of electrical contacts. The compliant dielectric layer can be contacted with the semiconductor wafer surface so that the pattern of holes is in an aligned position with the pattern of contacts and the compliant dielectric layer and the semiconductor wafer surface then bonded in the aligned position to unite the semiconductor wafer and the interposer component to form a wafer level semiconductor package. The wafer level semiconductor package can be diced to form individual semiconductor chip packages.

13 Claims, 11 Drawing Sheets

METHOD OF FORMING A WAFER LEVEL PACKAGE

CROSS-REFERENCE TO RELATED APPLICATIONS

This application claims the benefit of the filing date of U.S. Provisional Patent Application No. 61/005,607 filed Dec. 6, 2007, the disclosure of which is hereby incorporated herein by reference.

BACKGROUND OF THE INVENTION

The subject matter of the present application relates to microelectronic assemblies and methods for making microelectronic packages and assemblies at a wafer level.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself or by fine leads or wires extending between the contacts of the chip and the terminals or traces.

The dielectric substrate utilized in such a package can be made from a material such as a polyimide or other polymeric sheet. Although the thickness of the dielectric substrate will vary with the application, the dielectric substrate most typically is about 10 µm-100 µm thick. The terminals and conductive traces may be formed on the sheet from any electrically conductive material, but most typically are formed from copper, copper alloys, gold or combinations of these materials. The thickness of the traces will also vary with the application, but typically is about 5 µm-25 µm.

In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Microelectronic devices such as semiconductor chips normally are made by processing a large body of material, commonly referred to as a "wafer", to form features such as electronic circuits in numerous regions of the wafer and then severing of "dicing" the wafer to yield individual devices. Microelectronic packages also include wafer level packages. In manufacture of a wafer-level package, the wafer is subjected to a number of additional process steps to form the package structure and the wafer is subsequently diced to free the individual chips. Wafer level package processing provides an advantage in that the cost of the packaging processes is divided among the various chips on the wafer. Testing of individual chips poses another formidable problem with respect to individual handling and interfacing of the test equipment with the relatively delicate unpackaged chips. Wafer level package processing facilitates wafer level testing.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Certain embodiments disclosed in the aforementioned patents contemplate fabrication of the package structures in a wafer-level process. However, even further improvements would be desirable.

SUMMARY

In accordance with an aspect of the invention, a method is provided for forming a microelectronic package at a wafer level. Such method can include providing a semiconductor wafer having a surface with a pattern of electrical contacts thereon. An interposer component can be provided which has a compliant dielectric layer bonded to a conductive layer. A pattern of holes can be formed through the compliant dielectric layer and the conductive layer which corresponds to the pattern of electrical contacts. The compliant dielectric layer can be contacted with the semiconductor wafer surface so that the pattern of holes is in an aligned position with the pattern of contacts and the compliant dielectric layer and the semiconductor wafer surface can be bonded in the aligned position to unite the semiconductor wafer and the interposer component to form a wafer level semiconductor package. The wafer level semiconductor package can be diced to create individual semiconductor chip packages.

In accordance with such aspect of the invention, the compliant dielectric layer can be a b-stage polymer prior to bonding with the semiconductor wafer surface.

In addition, the compliant dielectric layer can be further polymerized during bonding with the semiconductor wafer surface.

In accordance with one or more further aspects of the invention, such method may include one or more further additional steps. For example, a second interposer component can be provided which has a second compliant dielectric layer bonded to a second conductive layer. A second pattern of holes can be formed which extend through the second compliant dielectric layer and the second conductive layer corresponding to the pattern of holes through the compliant dielectric layer and the conductive layer. The second compliant dielectric layer can be contacted with the conductive surface so that the second pattern of holes is in an aligned position with the pattern of contacts. The second compliant dielectric layer can be bonded with the conductive surface in the aligned position to unite the second interposer component and the interposer component.

In accordance with one or more further aspects of the invention, the holes in the second interposer component can be larger than the holes in the interposer component, whereby at least a portion of the conductive surface is exposed.

In accordance with an aspect of the invention, a method can be provided for forming microelectronic packages. In accordance with such aspect, a subassembly can be provided which includes a wafer having a pattern of contacts thereon. A dielectric layer may cover the wafer, and a conductive layer can cover the dielectric layer, with holes extending through the conductive layer and dielectric layer in alignment with the contacts. The subassembly can be treated so as to remove portions of the conductive layer and form individual conductive features. At least some of the conductive features can be wire-bonded to the contacts of the dielectric layers. The wire bonds can extend through the holes. The subassembly can then be severed to form a plurality of individual units.

In accordance with an aspect of the invention, the subassembly can be provided in a manner which includes forming the holes in the dielectric layer and conductive layer and then uniting the dielectric layer and conductive layer with the wafer.

The holes may be formed in a manner that includes punching a starting material including the conductive layer and the dielectric layer.

In the various figures of this specification, the various layers of materials are not drawn to scale but rather are depicted in various thicknesses for clarity or convenience of depiction. Also, the lateral boundaries of the various wafer, interposer, conductive layers and other packaging features show only a representative portion of the wafer scale package and will be understood by a person of skill in the art to be substantially replicated across the extent of a typical wafer.

DETAILED DESCRIPTION

Figure 1:
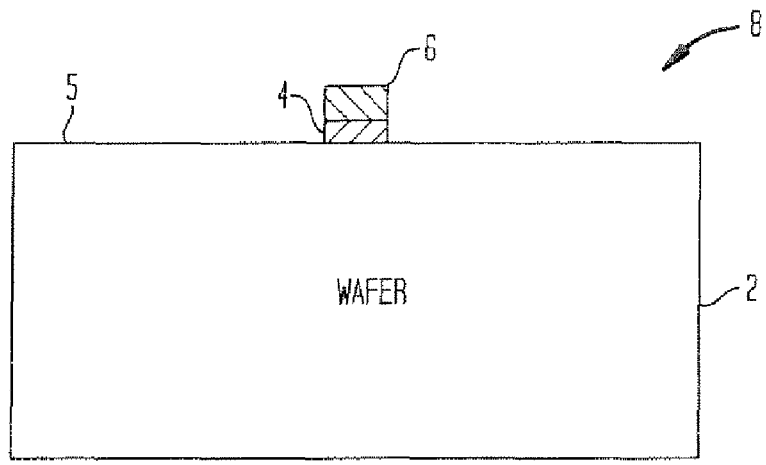
FIG. 1 is a sectional view of a portion of a wafer component during a manufacturing process in accordance with an embodiment.

Referring to FIG. 1, a wafer component 8 includes electrical contacts 4 on an upper surface 5 of a semiconductor wafer 2 containing integrated circuits attached together at dicing lanes (now shown). A contact 4 is typically fashioned of aluminum and is plated with a layer 6 of electro-less nickel in order to make the contact compatible with other metals to be deposited in subsequent steps. Although only one contact is visible in FIG. 1, the wafer contains a pattern of numerous chips and each chip has a pattern of numerous contacts. Once the contacts 4 are plated, the wafer component 8 is prepared for subsequent laminating with protective and signal carrying layers to form a plurality of chip packages at the wafer level for subsequent separation (dicing). Throughout this description, terms such as "upper," "lower," "top" and "bottom" do not refer to any gravitational positioning but instead refer to directions in the frame of reference of the components.

Figure 2:
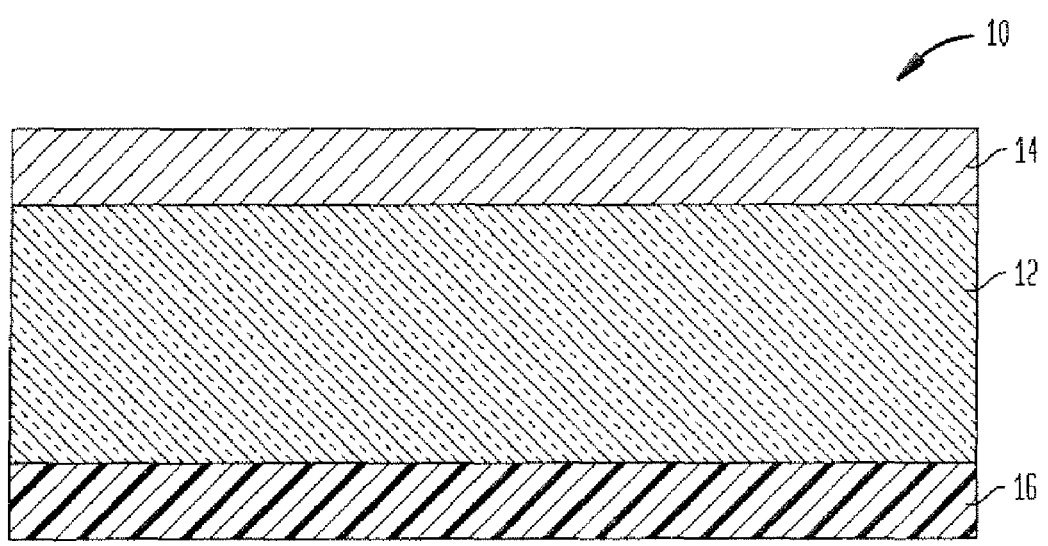
FIG. 2 is a sectional view of a portion of an interposer component during a manufacturing process in accordance with an embodiment.

As seen in FIG. 2, the stock for an interposer component 10 has a dielectric element 12 positioned adjacent a conductive top layer 14 with an optional bottom layer 16 disposed remote from the top layer 14. The dielectric element 12 is typically a polymer such as a polyimide sheet. The conductive top layer 14 can be a metallic sheet, which can include or consist essentially of copper. In a particular example, the thickness of the metallic sheet can range between 12 and 18 micrometers. The polymer dielectric element 14 may be only partially cross-linked, that is, B-stage, material which is tacky. Bottom layer 16 may optionally be a release film. One suitable stock is commercially available under the definition of TC-F-100 from Hitachi Chemical Co., Ltd.

The fabrication of an interposer component from a B-stage polymer dielectric layer 12 having a conductive sheet 14 attached thereto provides several advantages. Firstly, no adhesive may be needed to assemble the dielectric layer 12 to the sheet 14 or may be required when the dielectric layer is laminated to another element or substrate in subsequent operations, because the B-stage material is tacky and only partially cured. Secondly, the B-stage dielectric material is conformable to the substrate to allow proper adhesion and dimensional control of the overall thickness of the assembly until the B-stage material is fully polymerized.

Figure 3:
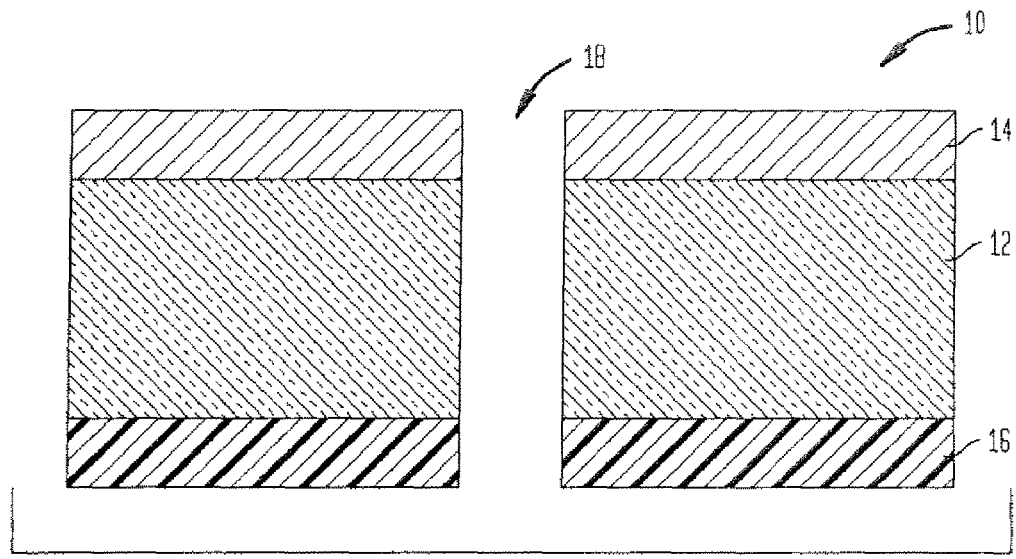
FIG. 3 is a sectional view illustrating an interposer such as shown in FIG. 2 at a later stage of a process in accordance with an embodiment.

In one stage of the process, as shown in FIG. 3, a pattern of through holes 18 is created through the entire thickness of the interposer component 10 including the conductive layer 14. The pattern forms clearance holes 18 that will correspond with the pattern of contacts 4 on the wafer. In this case, the through holes 18 are formed prior to assembling the interposer component 10 with the wafer component 8. The holes 18 may be formed by many methods such as physically removing material by mechanical, chemical or physical means. For example, the pattern of holes 18 may be punched with a matching die set, i.e., a punch and die having an opening such that the punch travels through the material into the opening of the die. The punching operation can be performed, in one example, with an additional polymer film (not shown) placed between the bottom sheet 16 and the die of such die set during the punching operation, so that the punch passes through the additional die layer before entering the die.

Figure 4:
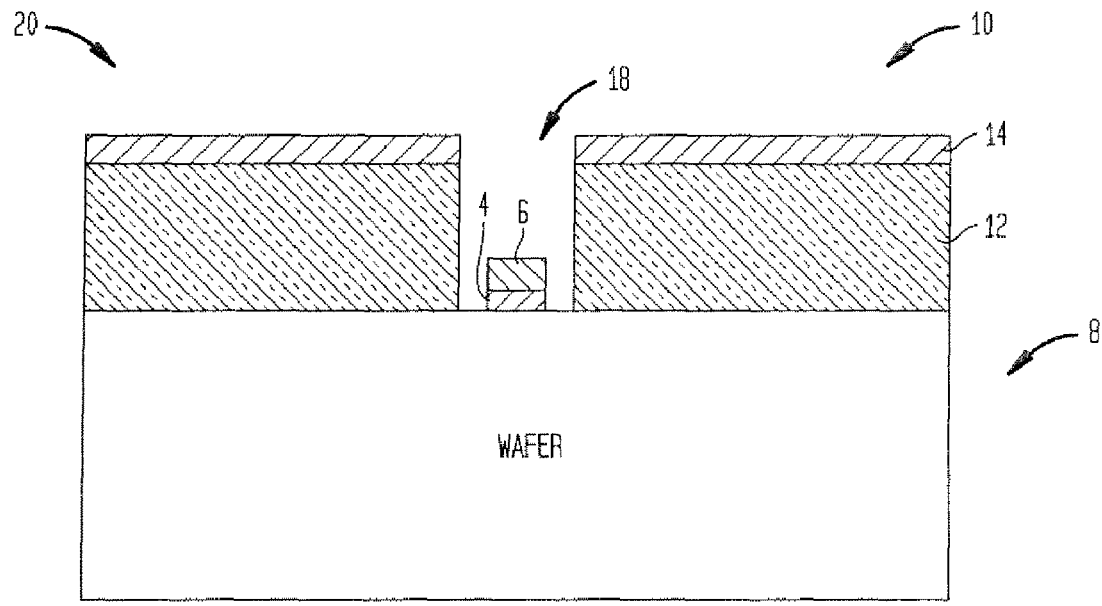
FIG. 4 is a sectional view illustrating an interposer component as shown in FIG. 3 as assembled to a wafer component (as illustrated, e.g., in FIG. 1) at a later stage of an assembly process.

Once the interposer component 10 is punched, the bottom sheet 16 is peeled and discarded. As shown in FIG. 4, the B-stage dielectric layer 12 is placed on top of the wafer component 8 with the pattern of holes 18 aligned with the pattern of contacts 4. The holes 18 may be sized sufficiently larger than the contacts 4 to readily provide sufficient pattern matching tolerances. A further advantage is that the positions of the contacts 4 are visible through the holes 18 to allow a machine vision system to directly optimize the placement of the pattern of holes 18 relative to the pattern of contacts 4 rather than rely on secondary datums and predicted positions of the contacts.

The components 8 and 10 are then laminated and the B-stage dielectric material is cured by known polymer curing methods to form an initial wafer level assembly 20. Thus wafer level assemblies 20, each having a resilient dielectric layer 12 and a conductive layer 14, are formed after assembly of an interposer component 10 with the wafer component 8. The assembly 20 provides access to the wafer contacts 4 without the need for patterning the holes 18 after assembly of an interposer component 10 with the wafer component 8. Moreover, the process of patterning the holes can be performed rapidly and economically by punching.

Figure 5:
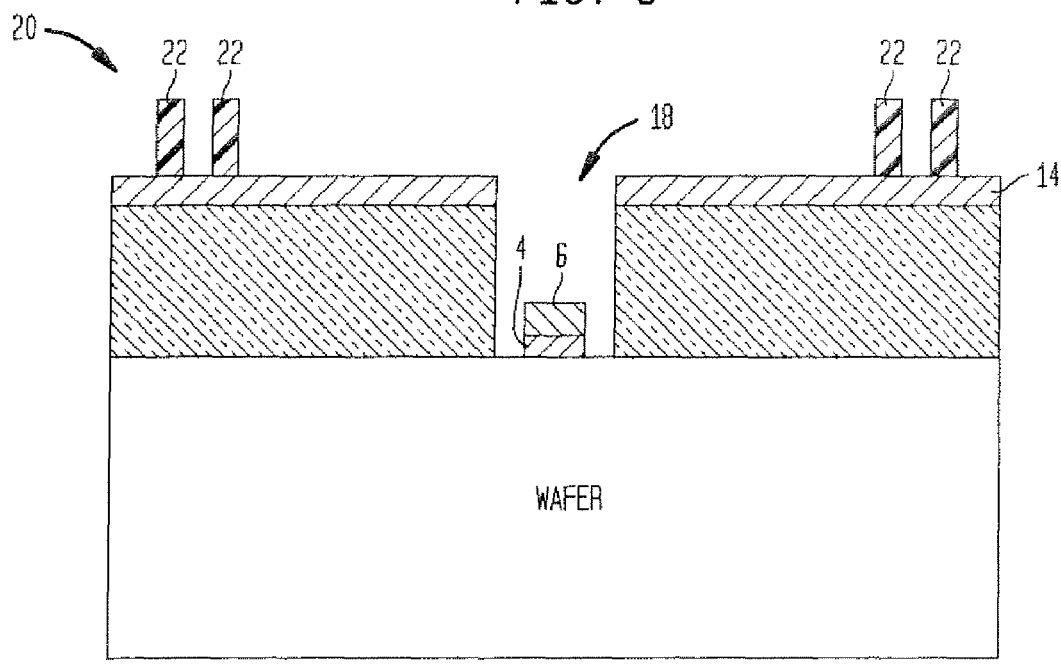
FIGS. 5-11 are sectional views illustrating stages in a method of manufacturing in accordance with one embodiment.

During the next phase of processing the conductive layer 14 is patterned or separated into distinct electrically conductive runs and terminals. As shown in FIG. 5 a resist mask 22 is created by processes such as applying electro-pneumatically deposited photoresist (EPDR), selectively exposing the photoresist to light, and developing the resist to leave the resist over those portions of the conductive layer 14 that will ultimately be removed in order to create the conductive features of the interposer.

Figure 6:
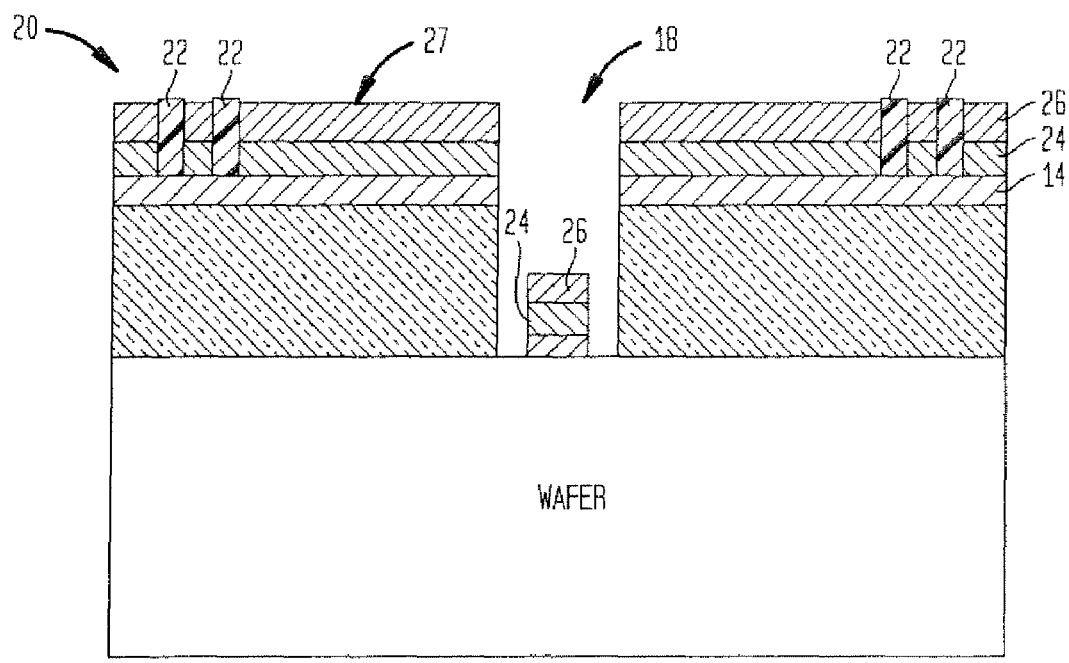
Figure 7:
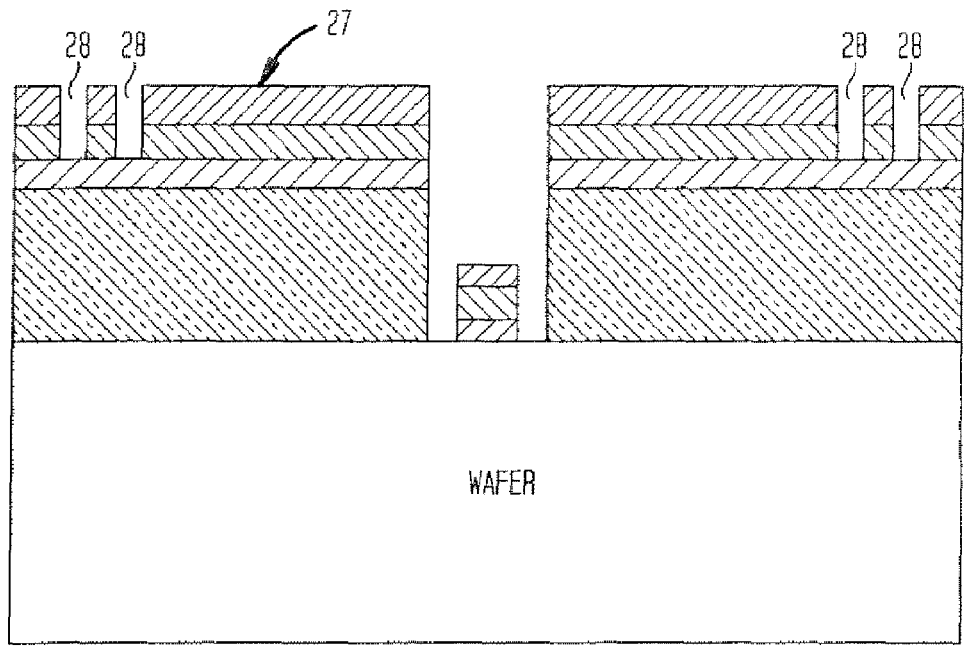

A layer of electroless or electroplated nickel 24 is then plated on the previously nickel plated surface 6 of the contacts 4 and on the exposed portions of the conductive layer 14 that are not covered by photo resist 22. A layer of gold 26 is then plated on the contacts and on the exposed potions of the conductive layer, as seen in the stage of the assembly 20 depicted in FIG. 6. The photoresist structures 22 are then stripped and an etchant such as nitric acid is used to remove the underlying conductive layer 14 in the portions of the package formerly covered by the photoresist. This etching forms channels 28 (FIG. 7) through the electrically conductive layers 14, 24 and 26 to create electrically distinct, separate conductive elements 27 in patterns constituting traces and terminals as shown in FIG. 7.

Figure 8:
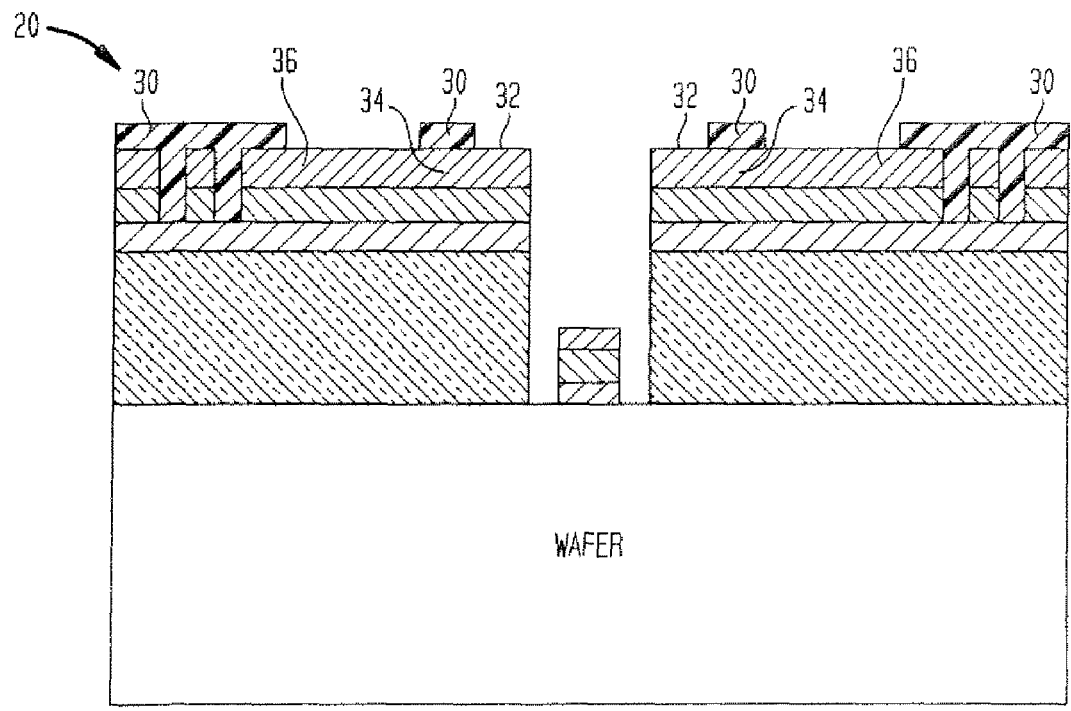
Figure 9:
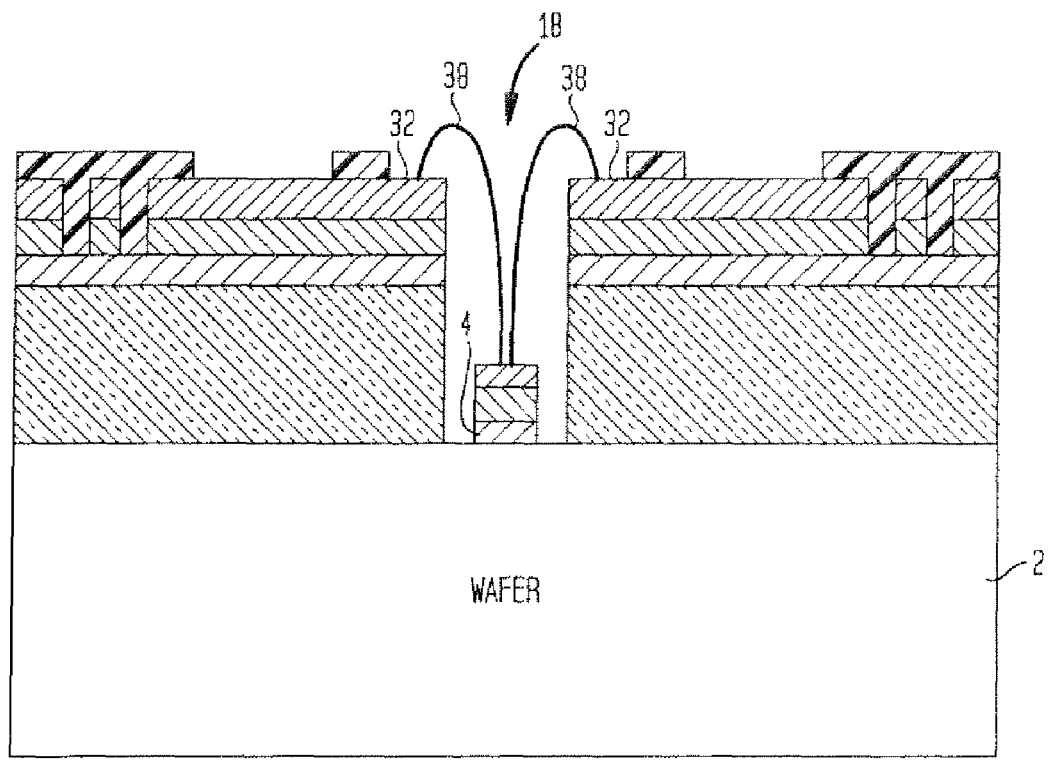
Figure 10:
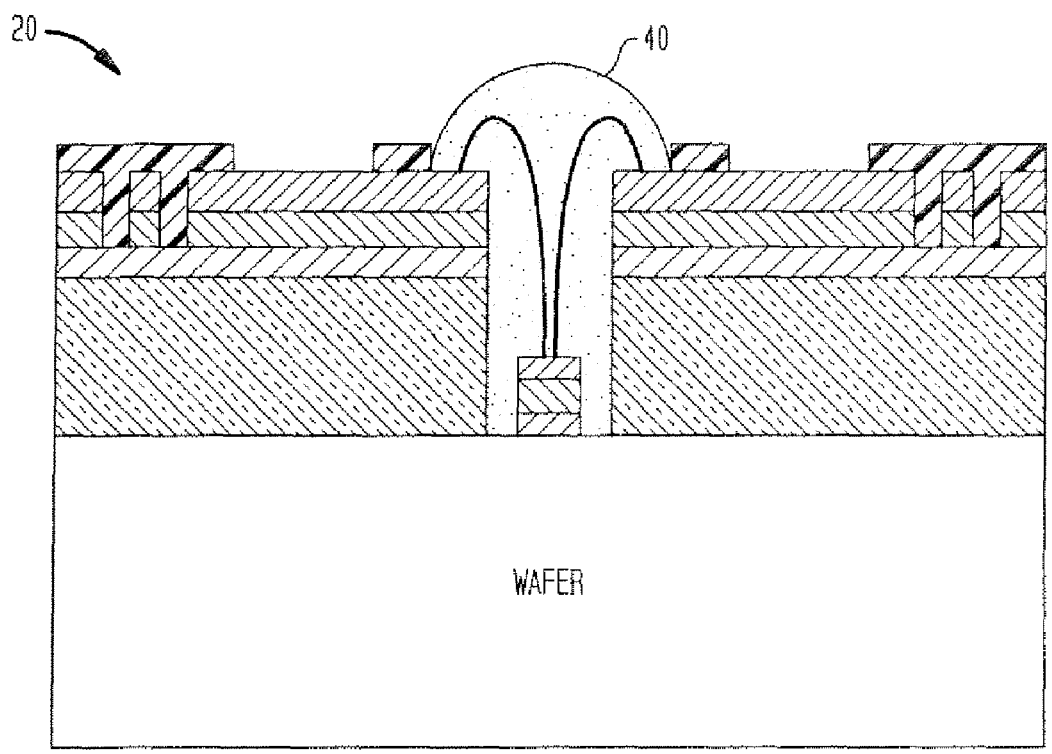
Figure 11:
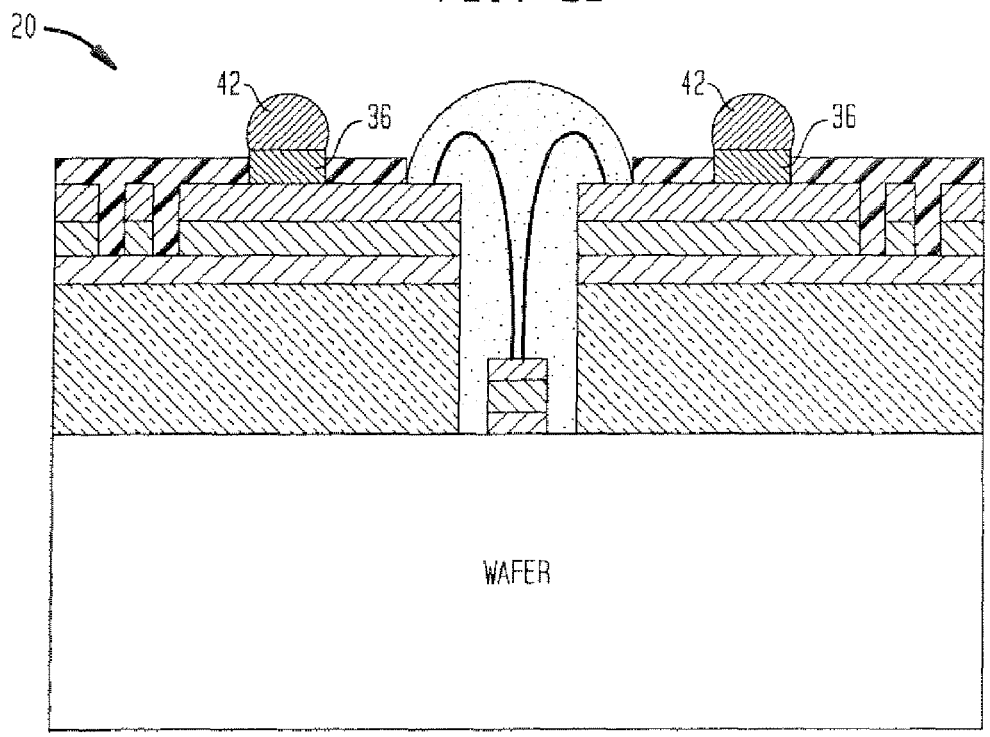

Referring to FIG. 8, solder mask 30 is then applied to the upper face of the wafer level assembly 20 to cover the conductive elements except in those areas of the conductive elements that form bond pads 32 and terminals 36. For example, the solder mask covers portions 34 of the conductive elements which serve as traces connecting the bond pads 32 and contacts 36. Next, as shown in FIG. 9, wire bonds 38 are used to electrically connect the plated contacts 4 of the wafer 2 to the bond pads 32. The wire bonds 38 extend from the contacts 2 through the holes 18 in the interposer component 10 to the bond pads 32. Encapsulant 40 is then used to fill, seal and protect the holes 18, wire bonds 38 and the bond pads 32 resulting in the wafer level assembly 20 as shown in FIG. 10. Fabrication of the wafer level assembly 20 optionally may include attaching an array of solder balls 42 to the terminals 36 as depicted in FIG. 11.

The process discussed above is substantially insensitive to manufacturing variations and thus provides a robust "tolerance budget." The holes 18 (FIG. 9) can be formed in a precise pattern in the stock using a relatively inexpensive punching process. Moreover, because the interposer element includes a continuous metal layer, it has predictable and substantially isotropic thermal expansion characteristics, and does not tend to stretch or shrink in horizontal dimensions parallel to the plane of the stock. This facilitates registering the holes 18 with numerous sets of contacts on a large wafer. Additionally; the holes 18 can be larger than the contacts on the wafer, so that any deviation from ideal placement of the punched interposer element on the wafer does not cause the interposer element to cover the contacts. Because the masking and etching processes used to form the individual conductive features from the conductive layer are performed after the interposer element is united with the wafer, tolerances on placement of the interposer element do not affect the location of the bond pads 32 (FIGS. 8 and 9) relative to the contacts. For example, the photolithographic process used to pattern the photoresist can be performed in registration with the wafer 2, so that the resulting conductive features, including the bond pads, are in a precise positional relationship with the bond pads. Additionally, the wire bonding process can compensate for any minor misalignment between the bond pads and the contacts. Some wire-bonding systems incorporate machine-vision systems which can detect the location of each contact, or each group of closely-spaced contacts on the wafer, and the location of the corresponding bond pads, and which can modify the motion of the wire-bonding tool accordingly.

The completed wafer level assembly 20 may then be tested and diced into individual packaged chips. In the dicing step, the wafer is cut into individual chips and the interposer component attached to the wafer is cut with the wafer into individual package elements assembled together with each chip. The circuitry and performance of each chip may be tested at the wafer level prior to dicing. This testing can be conducted by establishing electrical contacts for the test equipment through the terminals 36, before or after the addition of the solder balls 42.

Figure 12:
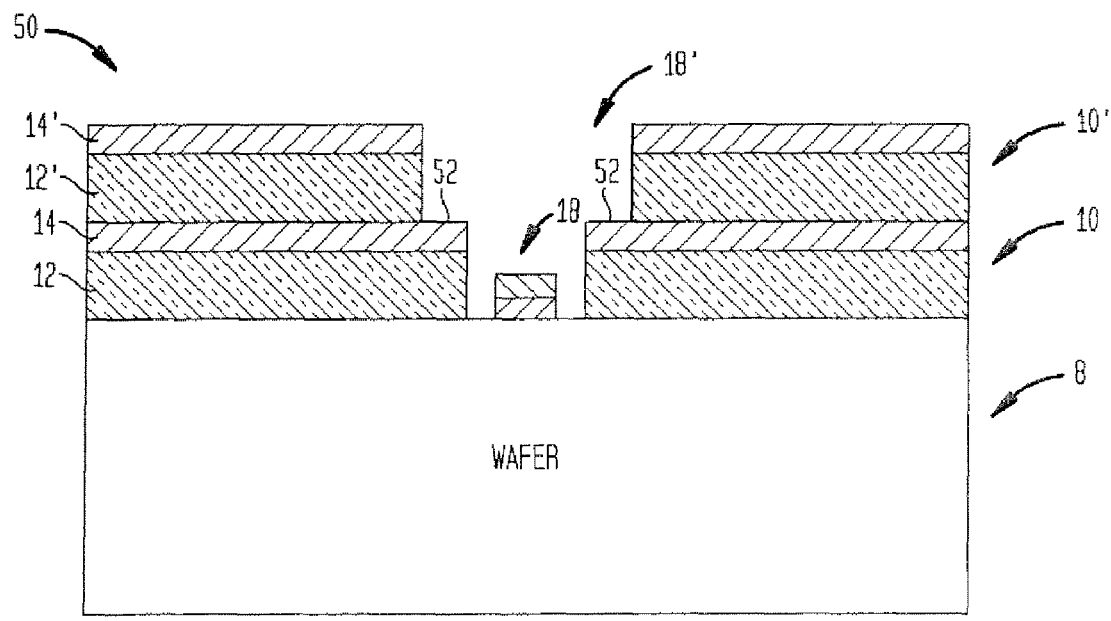
FIG. 12 is a sectional view illustrating an assembly according to another embodiment.

Turning to an embodiment depicted in FIG. 12 and subsequent figures, the process previously described is enhanced by steps to incorporate an additional interposer component 10' to the interposer component 10 to provide the wafer scale assembly 50 having a ground plane.

Second interposer component 10' has a dielectric element 12' positioned adjacent an exposed conductive top layer 14'. The second interposer component 10' typically has the same materials and characteristics as previously described for the interposer component 10, although variations in dielectric and conductive materials, as well as layer thickness can be used. By methods disclosed in the description of FIG. 3, a first pattern of through holes 18 is created through the first interposer component 10 and a second pattern of through holes 18' can be formed to extend through the second interposer component 10'. The second pattern forms clearance holes that will correspond with the pattern of contacts 4 on the wafer and the first pattern of holes 18 created through the interposer component 10. The creation of through holes 18 and 18' occurs prior to assembling the interposer components 10 and 10' with the wafer component 8 to form the assembly 50. The holes 18' can have larger horizontal dimensions than the holes 18.

As discussed above, if the stock used to form the interposer components 10, 10' includes a release layer, the release layer is peeled and discarded. As shown in FIG. 12, the interposer component 10 is assembled with the wafer component 8 by placing the B-stage dielectric layer 12 on top of the wafer component 8 with the pattern of holes 18 aligned with the pattern of contacts 4. The interposer component 10' is placed on the interposer component 10 with the B-stage dielectric layer 12' on top of the conductive layer with the pattern of holes 18' aligned with the pattern of holes 18. If desired, the interposer components 10 and 10' may also be assembled together prior to being united with the wafer component 8. Because the holes 18' are sufficiently larger than the holes 18, a land region 52 of the conductive layer 14 remains exposed to provide access for electrical connections to the conductive layer 14. As discussed below, layer 14 will ultimately serve as a ground plane. Here again, the method of forming holes through interposer components prior to assembly provides tolerance advantages. Creating stepped holes 18 and 18' with lands 52 would be difficult after the interposer components were united with the wafer component.

The components 8, 10 and 10' are then laminated by curing the B-stage dielectric by known polymer curing methods to form an initial wafer level assembly 50, as seen in FIG. 12. Thus, a wafer level assembly 50 having resilient dielectric layers 12 and 12', conductive layer 14 and conductive ground plane layer 14' is formed after assembly of the interposer components 10 and 10' with the wafer component 8.

Figure 13:
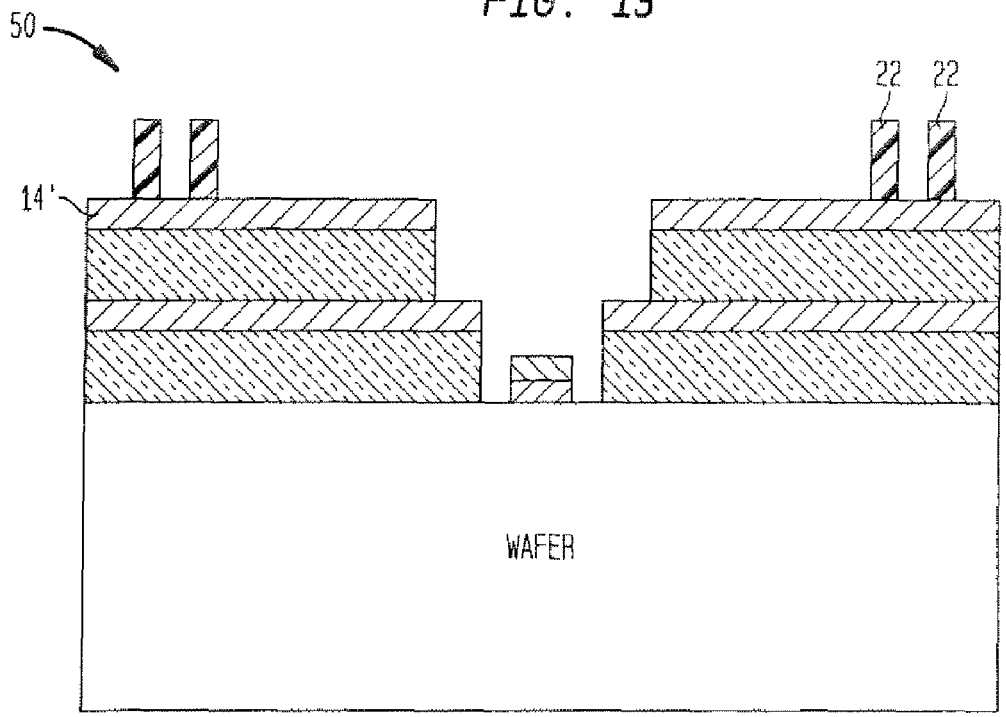
FIGS. 13-19 are sectional views illustrating stages in a method of manufacturing an assembly such as illustrated in FIG. 12 in accordance with one embodiment.
Figure 14:
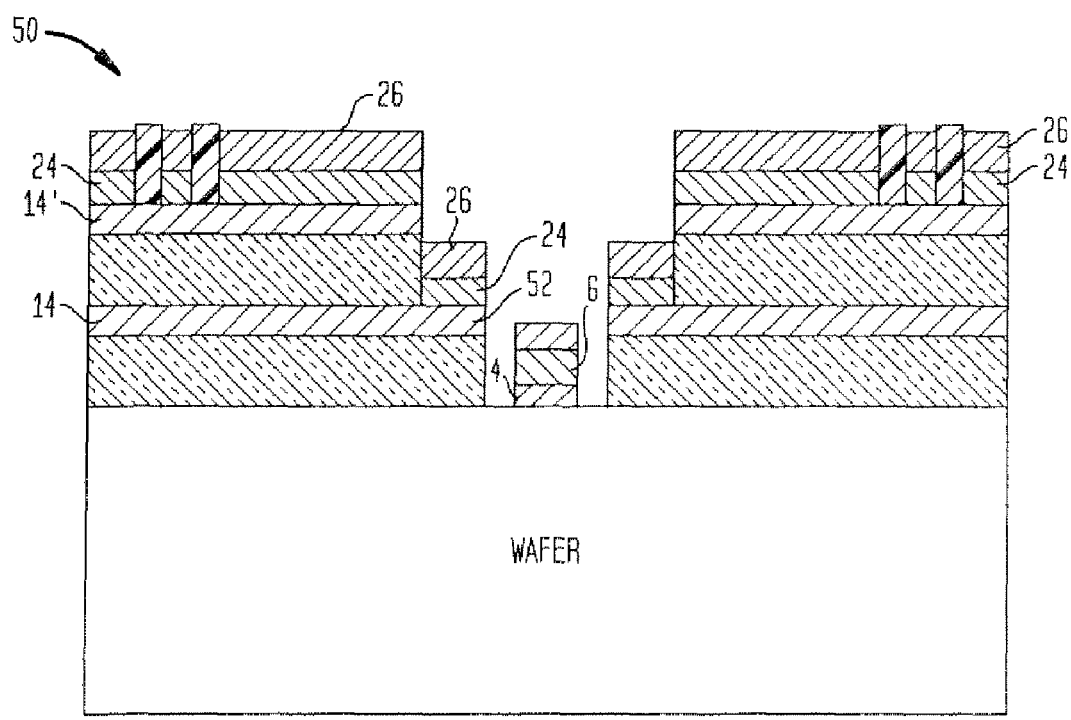
Figure 15:
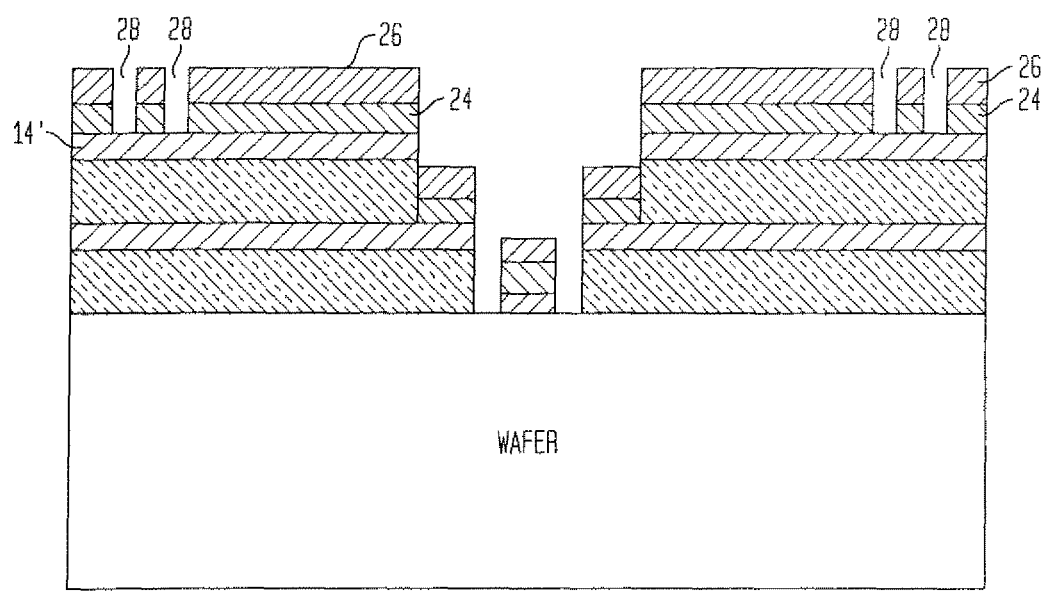

During the next phase of processing the conductive layer 14' is patterned or separated into distinct electrically conductive traces and terminals using steps similar to those discussed above. As shown in FIG. 13 a resist mask 22 is created by processes such as applying an electro-pneumatically deposited photoresist (EPDR), selectively exposing the photoresist to light, and developing the resist to leave the resist over those portions of the conductive layer 14' that are ultimately to be removed in order to create the conductive runs and terminals. A layer of electroless or electroplated nickel 24 and a layer of gold 26 are then plated on the previously nickel plated surface 6 of the contacts 4, the lands 52 and the exposed portions of the conductive layer 14' that are not covered with resist mask 22, to result in the stage of the assembly 50 depicted in FIG. 14. The photoresist structures 22 are then stripped as shown in FIG. 15 and an etchant such as nitric acid is used to remove the underlying conductive layer 14' in the portions of the assembly formerly covered by the photoresist. This etching create channels 28 through all the electrically conductive layers 14', 24 and 26 to create electrically distinct and conductive elements 27 in patterns suitable for traces and terminals as shown in FIG. 16.

Figure 16:
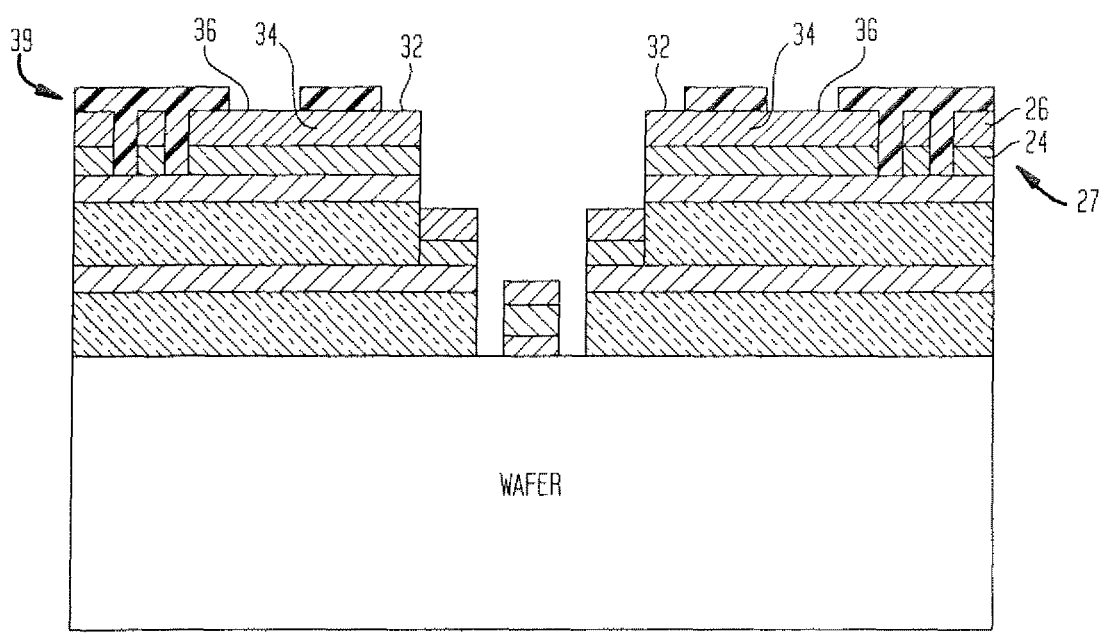
Figure 17:
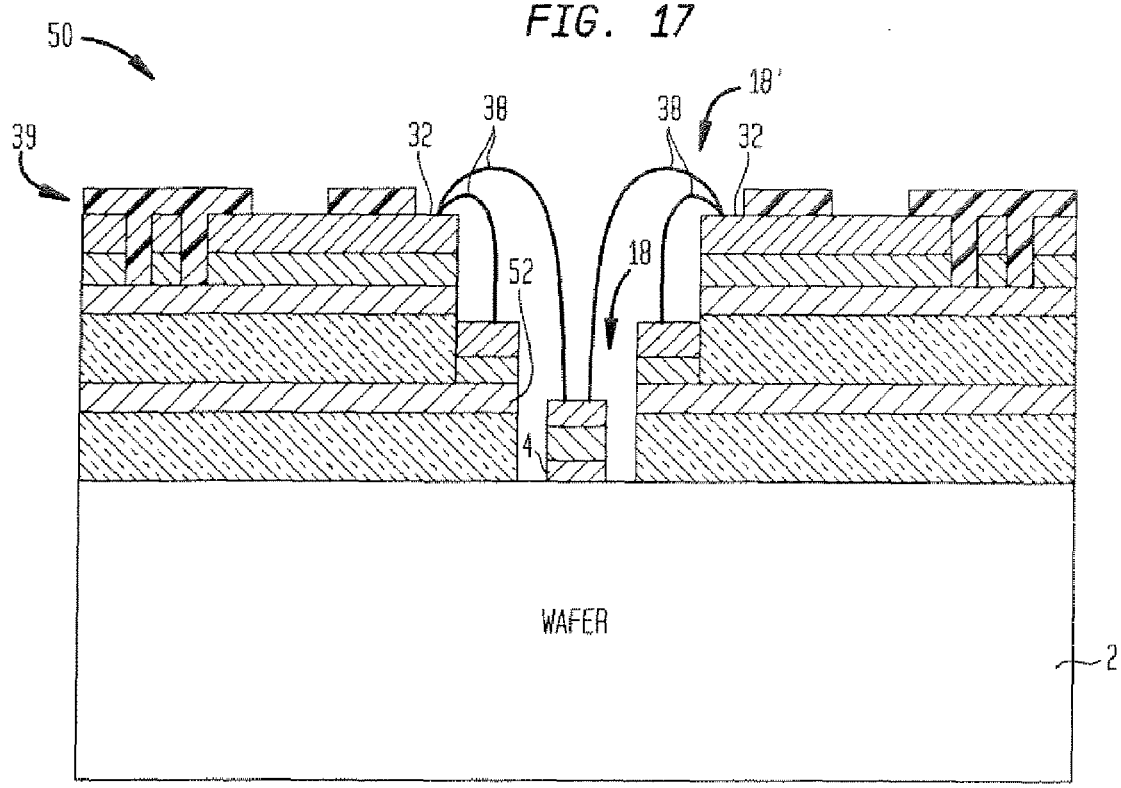
Figure 18:
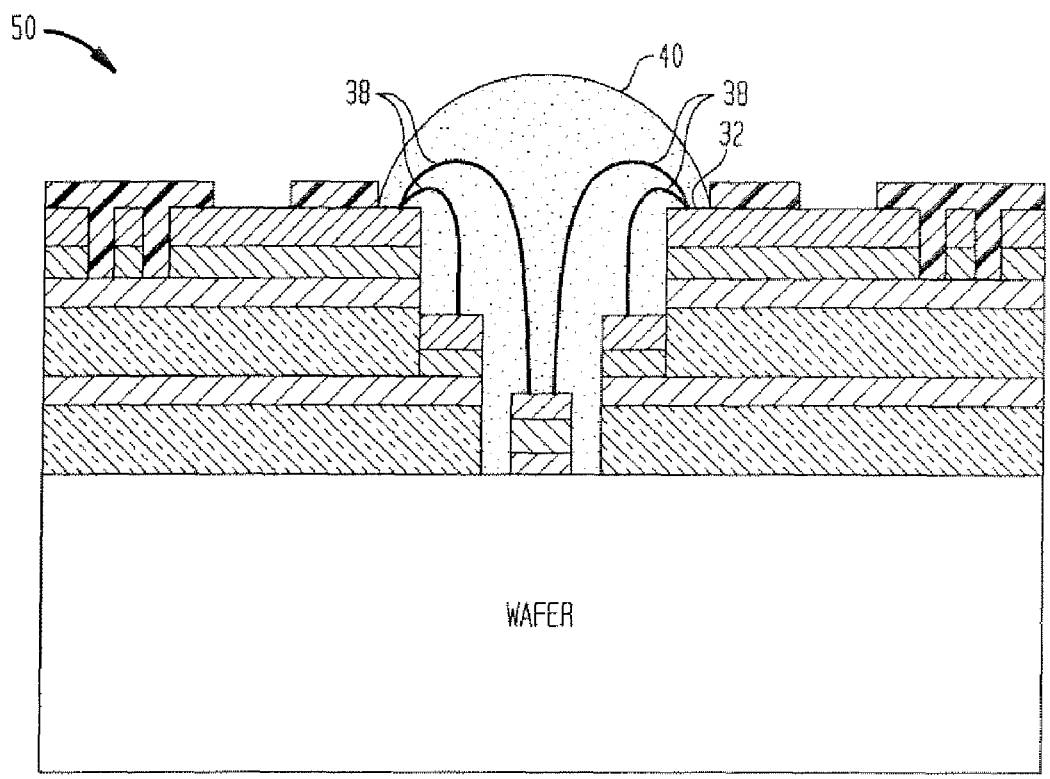
Figure 19:
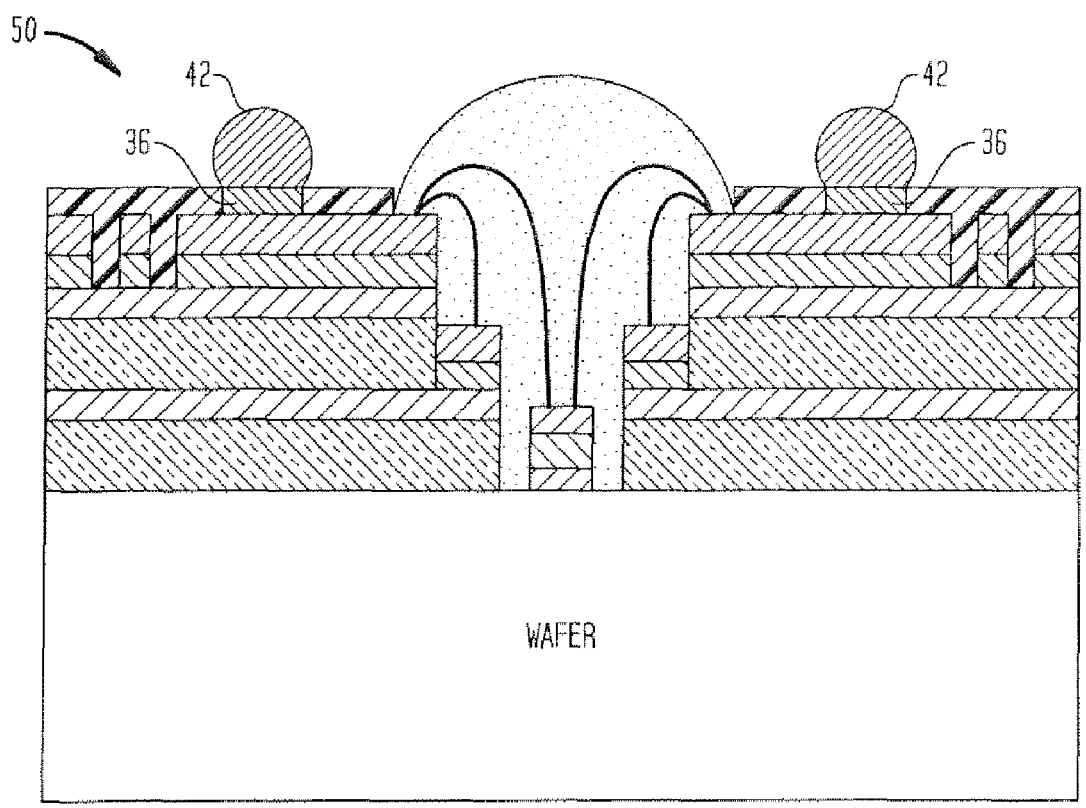

Solder mask 39 can then be applied to the upper face of the assembly 50 in order to establish portions of the conductive elements 27 as the bond pads 32, traces 34 and terminals 36 (FIG. 16). Next, as shown in FIG. 17 wire bonds 38 are used to electrically connect the plated contacts 4 of the wafer 2 to the bond pads 32 or to connect the lands 52, as required by the chip circuitry and functions. Encapsulant 40 (FIG. 18) is then used to fill, seal and protect the holes 18 and 18', wire bonds 38 and the bond pads 32 resulting in the wafer level assembly 50 shown in FIG. 18. Fabrication of the wafer level assembly 50 optionally may include attaching an array of solder balls terminals 36 with the terminals 36 exposed at a top surface of the assembly 50, as depicted in FIG. 19. The assembly 50 may then be diced into individual chip packages each containing one or more semiconductor chips diced from the original wafer 2.

In the process illustrated in FIGS. 12-19, the conductive layer 14 of the lower interposer element 10, disposed closest to the wafer surface, is not etched, but instead, is left as a continuous ground plane in the finished structure. In a variant of this process, conductive layer 14 may be formed into individual conductive features such as traces, bond pads and terminals. The upper interposer element 10' may be provided with additional holes (not shown) in alignment with terminals formed from the conductive layer of the lower interposer element 10. In further variants, more than two interposer elements can be assembled together with the wafer in each wafer level assembly. In a particular embodiment, more than two interposer elements can be stacked vertically overlying the chip in each completed chip package.

Figure 20:
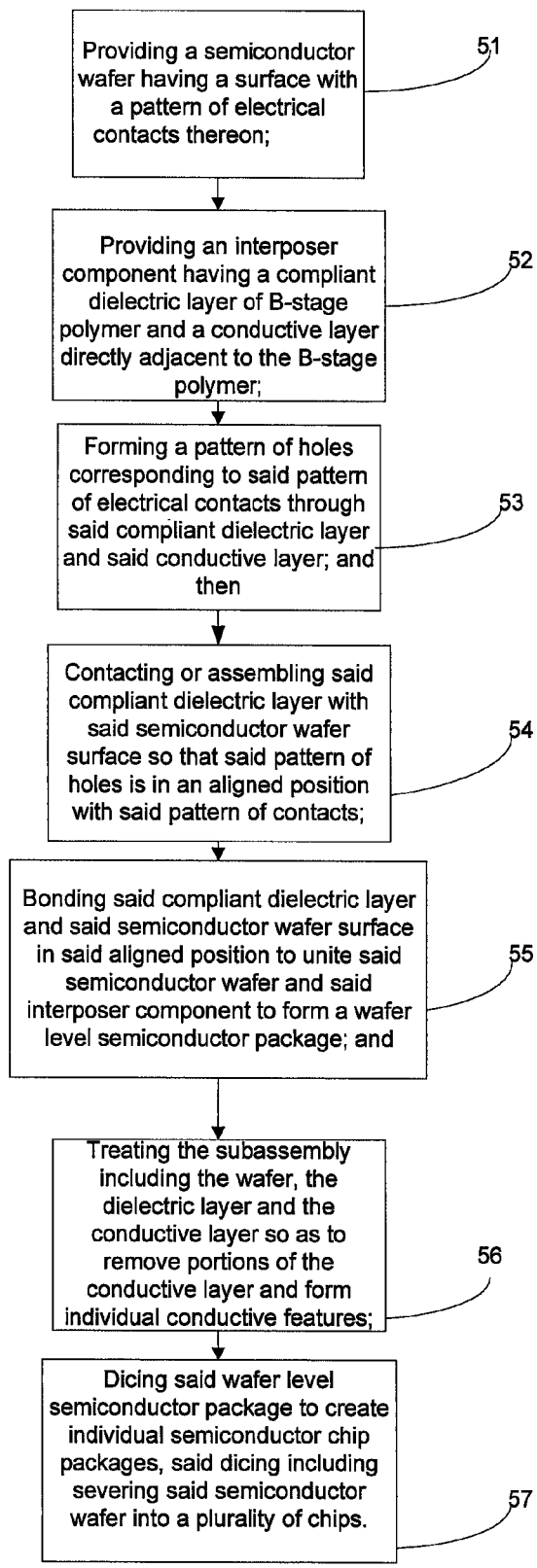
FIG. 20 is a diagram depicting a method of forming a microelectronic package at a wafer level in accordance with an embodiment.

Referring to FIG. 20, a method is provided for forming a microelectronic package at a wafer level. Such method can include providing a semiconductor wafer having a surface with a pattern of electrical contacts thereon (51). An interposer component can be provided (52) which has a compliant dielectric layer of B-stage polymer and a conductive layer directly adjacent to the B-stage polymer dielectric layer. A pattern of holes can be formed (53) through the compliant dielectric layer and the conductive layer which corresponds to the pattern of electrical contacts. The compliant dielectric layer can be contacted (54) with the semiconductor wafer surface so that the pattern of holes is in an aligned position with the pattern of contacts, and the compliant dielectric layer and the semiconductor wafer surface can be bonded (55) in the aligned position to unite the semiconductor wafer and the interposer component to form a wafer level semiconductor package. The wafer level semiconductor package can be diced (57) to create individual semiconductor chip packages, the dicing including severing the semiconductor wafer into a plurality of clips.

Figure 21:
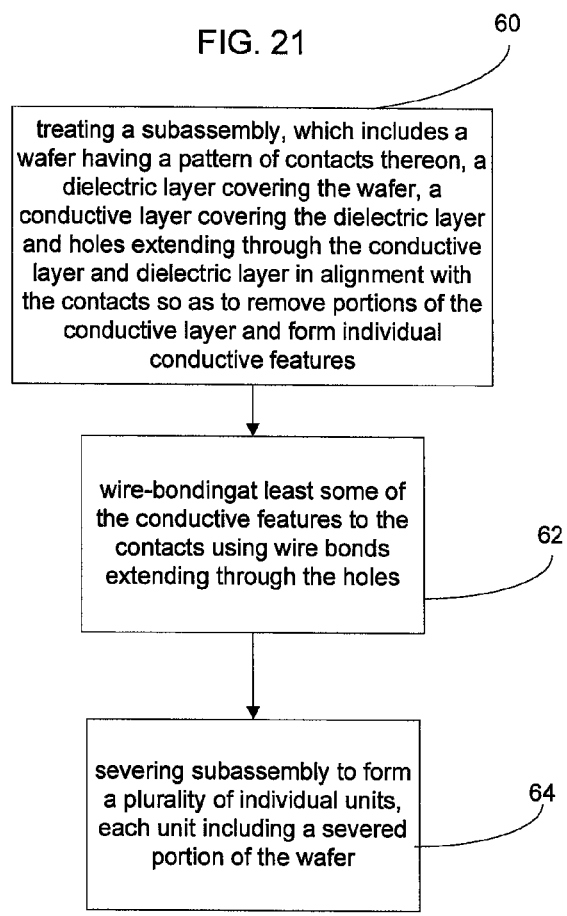
FIG. 21 is a diagram depicting a method of forming microelectronic packages in accordance with an embodiment.

With reference to FIG. 21, a particular embodiment may include treating (60) a subassembly, which includes a wafer having a pattern of contacts thereon, a dielectric layer covering the wafer, a conductive layer covering the dielectric layer and holes extending through the conductive layer and dielectric layer in alignment with the contacts so as to remove portions of the conductive layer and form individual conductive features. The method further includes: wire-bonding (62) at least some of the conductive features to the contacts using wire bonds extending through the holes; and severing (64) subassembly to form a plurality of individual units, each unit including a severed portion of the wafer.

Although the invention herein has been described with reference to particular embodiments, it is to be understood that these embodiments are merely illustrative of the principles and applications of the present invention. For example, the stock for an interposer component 10 can be formed in many ways, such as by utilizing a fully cross-linked dielectric element 12 and adhesives to adhere the conductive top layer 14 and to bond the dielectric element 12 to the wafer. It is therefore to be understood that numerous modifications may be made to the illustrative embodiments and that other arrangements may be devised without departing from the spirit and scope of the present invention.

The invention claimed is:

1. A method of forming a microelectronic package at a wafer level comprising the steps of:

(a) providing a semiconductor wafer having a surface with a pattern of electrical contacts thereon;

(b) providing an interposer component having a compliant dielectric layer of B-stage polymer and a conductive layer directly adjacent to the B-stage polymer;

(c) forming a pattern of holes corresponding to said pattern of electrical contacts through said compliant dielectric layer and said conductive layer; and then (d) contacting said compliant dielectric layer with said semiconductor wafer surface so that said pattern of holes is in an aligned position with said pattern of contacts;

(e) bonding said compliant dielectric layer and said semiconductor wafer surface in said aligned position to unite said semiconductor wafer and said interposer component to form a wafer level semiconductor package; and (f) dicing said wafer level semiconductor package to create individual semiconductor chip packages, said dicing including severing said semiconductor wafer into a plurality of chips.

2. The method as set forth in claim 1 wherein:

said compliant dielectric layer is further polymerized during bonding with said semiconductor wafer surface.

3. The method as set forth in claim 1 comprising the additional steps of:

(a) providing a second interposer component having a second compliant dielectric layer bonded to a second conductive layer;

(b) forming a second pattern of holes through said second compliant dielectric layer and said second conductive layer corresponding to said pattern of holes through said compliant dielectric layer and said conductive layer; and then (c) contacting said second compliant dielectric layer with said conductive surface so that said second pattern of holes is in an aligned position with said pattern of contacts; and (d) bonding said second compliant dielectric layer and said conductive surface in said aligned position to unite said second interposer component and said interposer component.

4. A method of forming a microelectronic package at a wafer level comprising the steps of:

(a) providing a semiconductor wafer having a surface with a pattern of electrical contacts thereon;

(b) providing an interposer component having a compliant dielectric layer bonded to a conductive layer;

(c) forming a pattern of holes corresponding to said pattern of electrical contacts through said compliant dielectric layer and said conductive layer; and then (d) contacting said compliant dielectric layer with said semiconductor wafer surface so that said pattern of holes is in an aligned position with said pattern of contacts;

(e) bonding said compliant dielectric layer and said semiconductor wafer surface in said aligned position to unite said semiconductor wafer and said interposer component to form a wafer level semiconductor package;

(f) providing a second interposer component having a second compliant dielectric layer bonded to a second conductive layer;

(g) forming a second pattern of holes through said second compliant dielectric layer and said second conductive layer corresponding to said pattern of holes through said compliant dielectric layer and said conductive layer; and then (h) contacting said second compliant dielectric layer with said interposer component so that said second pattern of holes is in an aligned position with said pattern of contacts;

(i) bonding said second compliant dielectric layer and said interposer component in said aligned position to unite said second interposer component and said interposer component; and (j) dicing said wafer level semiconductor package to create individual semiconductor chip packages.

5. A method of forming microelectronic packages comprising:

(a) providing a subassembly including a wafer having a pattern of contacts thereon, a dielectric layer covering the wafer, a conductive layer covering the dielectric layer and holes extending through the conductive layer and dielectric layer in alignment with the contacts; then (b) treating the subassembly so as to remove portions of the conductive layer and form individual conductive features;

(c) wire-bonding at least some of the conductive features to the contacts using wire bonds extending through the holes; and (d) severing the subassembly to form a plurality of individual units, each unit including a severed portion of the wafer.

6. A method as set forth in claim 5 wherein the step of providing a subassembly includes forming the holes in the dielectric layer and conductive layer and then uniting the dielectric layer and conductive layer with the wafer.

7. A method as set forth in claim 6 wherein the step of forming the holes includes punching a starting material including the conductive layer and the dielectric layer.

8. A method as set forth in claim 5 wherein the step of treating the subassembly includes selectively etching the conductive layer.

9. A method of forming a microelectronic package at a wafer level comprising the steps of:

(a) providing a semiconductor substrate having a major surface with a pattern of electrical contacts thereon;

(b) providing an interposer component having a compliant dielectric layer of B-stage polymer, a conductive layer directly adjacent to the B-stage polymer, and a pattern of holes corresponding to said pattern of electrical contacts extending through said compliant dielectric layer and said conductive layer; and then (c) assembling said interposer component with said semiconductor substrate so that at least some of said contacts are exposed within said holes; and (d) dicing said wafer level assembly into a plurality of semiconductor chip packages each containing at least one semiconductor chip, said dicing including severing said semiconductor substrate into a plurality of said semiconductor chips.

10. The method as set forth in claim 9 wherein:

said compliant dielectric layer is bonded with said major surface of said substrate and is further polymerized during said bonding.

11. The method as set forth in claim 9 comprising the additional steps of:

providing a second interposer component having a second compliant dielectric layer bonded to a second conductive layer and a second pattern of holes corresponding to said pattern of holes extending through said second compliant dielectric layer and said second conductive layer and includes assembling said second interposer component layer with said interposer component and said substrate so that said contacts are exposed within said first and second holes.

12. The method as set forth in claim 4 wherein:
said holes in said second interposer component are larger than said holes in said interposer component whereby at least a portion of said conductive surface of said interposer component is exposed.

13. A method of forming a microelectronic package at a wafer level comprising the steps of:
(a) providing a semiconductor substrate having a major surface with a pattern of electrical contacts thereon;
(b) providing an interposer component having a compliant dielectric layer bonded to a conductive layer and a pattern of holes corresponding to said pattern of electrical contacts extending through said compliant dielectric layer and said conductive layer;
(c) providing a second interposer component having a second compliant dielectric layer bonded to a second conductive layer and a second pattern of holes corresponding to said pattern of holes extending through said second compliant dielectric layer and said second conductive layer;
(d) assembling said second interposer component with said interposer component and said substrate so that said contacts are exposed within said first and second holes; and
(e) dicing said wafer level assembly into a plurality to form semiconductor chip packages each containing at least one semiconductor chip.

* * * * *